(12) United States Patent
Schuessler et al.

(10) Patent No.: US 8,686,819 B2
(45) Date of Patent: Apr. 1, 2014

(54) MAGNETIC HOLDING DEVICE AND METHOD FOR HOLDING A SUBSTRATE

(75) Inventors: Uwe Schuessler, Aschaffenburg (DE); Stefan Bangert, Steinau (DE); Heike Landgraf, Bruchkoebel (DE)

(73) Assignee: Applied Materials, Inc., Santa Clara, CA (US)

( * ) Notice: Subject to any disclaimer, the term of this patent is extended or adjusted under 35 U.S.C. 154(b) by 331 days.

(21) Appl. No.: 12/818,392

(22) Filed: Jun. 18, 2010

(65) Prior Publication Data

US 2011/0304418 A1   Dec. 15, 2011

(30) Foreign Application Priority Data

Jun. 15, 2010   (EP) .................................. 10166021

(51) Int. Cl.
*H01F 7/20*   (2006.01)
*H01F 7/00*   (2006.01)

(52) U.S. Cl.
USPC .......................................... 335/289; 335/296

(58) Field of Classification Search
USPC .......................................... 335/285–287, 289
See application file for complete search history.

(56) References Cited

U.S. PATENT DOCUMENTS

| | | | | |
|---|---|---|---|---|
| 4,089,603 A * | 5/1978 | Jacobs | ............................. | 355/73 |
| 4,963,921 A * | 10/1990 | Kariya et al. | .................... | 355/53 |
| 5,160,959 A * | 11/1992 | Everett et al. | .................... | 355/53 |
| 5,608,773 A | 3/1997 | Korenaga et al. | | |
| 5,847,813 A * | 12/1998 | Hirayanagi | ....................... | 355/75 |
| 6,489,871 B1 * | 12/2002 | Barton | ......................... | 335/285 |
| 6,888,621 B2 * | 5/2005 | Araki et al. | ....................... | 355/75 |
| 6,903,786 B2 * | 6/2005 | Takahashi et al. | .............. | 349/38 |
| 7,196,775 B2 * | 3/2007 | Galburt | ........................... | 355/75 |
| 2006/0148114 A1 * | 7/2006 | Yotsuya et al. | .................. | 438/29 |
| 2006/0266718 A1 | 11/2006 | Tischner et al. | | |
| 2008/0024751 A1 | 1/2008 | Hirayanagi | | |
| 2010/0112194 A1 | 5/2010 | Inoue et al. | | |

FOREIGN PATENT DOCUMENTS

JP   2004103799 A   4/2004
JP   2005150759 A   6/2005

OTHER PUBLICATIONS

Extended European Search Report dated Feb. 2, 2011 for European Patent Application No. 10166021.5.

* cited by examiner

*Primary Examiner* — Alexander Talpalatski
(74) *Attorney, Agent, or Firm* — Patterson & Sheridan, L.L.P.

(57) ABSTRACT

A magnetic holding device is adapted for holding a mask during processing of a substrate. The magnetic holding device includes a substrate carrier which is adapted for receiving the substrate to be processed. The substrate carrier includes a permanent magnet adapted for generating a first magnetic field for holding the mask. Furthermore, the substrate carrier includes a solenoid which is adapted for generating a second magnetic field adapted for at least partially compensating the first magnetic field. In case the first magnetic field is compensated, at least partially, by means of the second magnetic field, the mask is released from the substrate carrier.

20 Claims, 6 Drawing Sheets

MAGNETIC HOLDING DEVICE AND METHOD FOR HOLDING A SUBSTRATE

TECHNICAL FIELD OF THE INVENTION

Embodiments of the present invention relate to a substrate processing apparatus, and in particular relate to a holding device for holding a mask during substrate processing. The holding device may be used for handling substrates, e.g. for use in alternative energy products, such as solar cells or for use in illumination devices such as light emitting diodes (LED) or organic light emitting diodes (OLED). Furthermore, the present invention relates to a method for handling a mask during substrate processing.

BACKGROUND OF THE INVENTION

Substrates may be processed for a wide variety of applications, e.g. in the microelectronics industry, for forming photovoltaic layers, for modifying surfaces, etc. Furthermore, thin films may be applied onto surfaces of substrates by appropriate deposition techniques. In order to apply deposition material in a desired pattern onto a target portion of a substrate to be processed, a mask may be used wherein the mask may be provided as a shadow mask. The pattern of the shadow mask defines portions where deposition material can reach the surface of the substrate and portions where the surface of the substrate is shielded from deposition material such that a pattern corresponding to an individual layer atop the substrate may be achieved.

For different patterns to be deposited onto the surface of the substrate, a variety of masks, such as shadow masks may be provided. In many cases a mask has to be arranged atop the substrate to be processed at a predetermined location. After a deposition process, the mask is removed and another mask may be used for at least one subsequent deposition process. During such kind of substrate processing, mask handling is an issue.

SUMMARY OF THE INVENTION

In light of the above, a magnetic holding device adapted for holding a mask and a substrate for processing the substrate in accordance with independent claim 1 is provided. Furthermore, a method for handling a mask for processing the substrate in accordance with independent claim 7 is provided.

According to one embodiment, a magnetic holding device adapted for holding a mask and a substrate for processing the substrate is provided, the magnetic holding device including a substrate carrier adapted for receiving the substrate to be processed, the substrate carrier including a permanent magnet adapted for generating a first magnetic field for holding the mask; and a solenoid adapted for generating a second magnetic field adapted for at least partially compensating the first magnetic field for removing the mask.

According to a further embodiment, a method for handling a mask for processing of a substrate is provided, the method including providing a substrate carrier; attaching the substrate to be processed to the substrate carrier; providing the mask for masking the substrate; connecting the mask and the substrate carrier by means of a first magnetic field; generating a second magnetic field for at least partially compensating the first magnetic field; and releasing the mask from the substrate carrier.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE EMBODIMENTS

Figure 1:
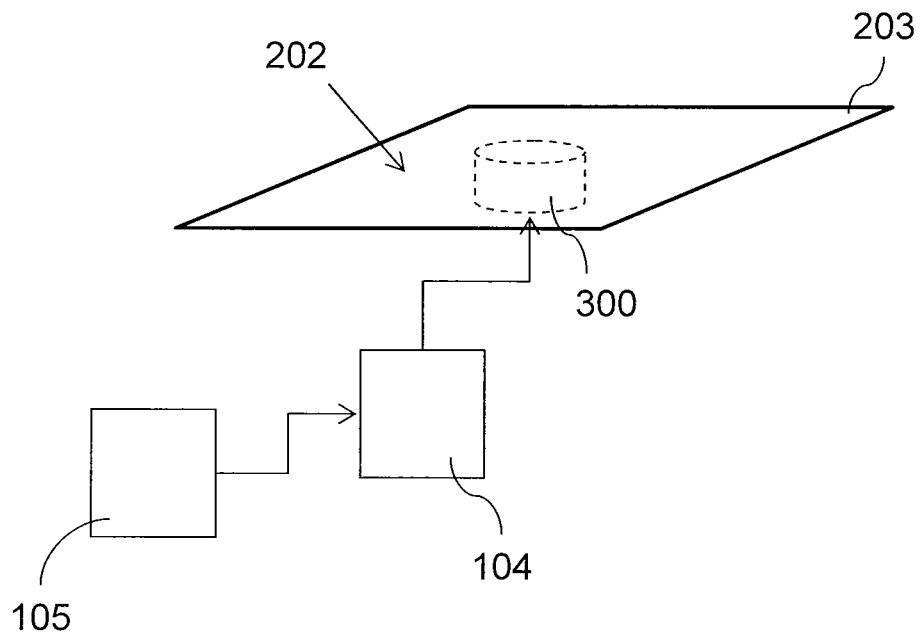
FIG. 1 shows a schematic block diagram of a magnetic holding device for holding a mask frame according to a typical embodiment.

Reference will now be made in detail to the various embodiments of the invention, one or more examples of which are illustrated in the drawings. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Embodiments described herein refer inter alia to a magnetic holding device adapted for holding a mask and a substrate for processing the substrate, wherein the magnetic holding device includes a substrate carrier. The substrate carrier is adapted for receiving the substrate to be processed and includes a permanent magnet adapted for generating a first magnetic field for holding a mask and a solenoid adapted for generating a second magnetic field adapted for at least partially compensating the first magnetic field for removing the mask. Thus, the mask may be held at or near the substrate to be processed by means of the action of the first magnetic field.

In order to provide an efficient mask handling, the mask may be released after substrate processing by applying a second magnetic field which at least partially compensates the first magnetic field. The second magnetic field is generated by an electric coil such as, but not restricted to, a cylindrical coil or a solenoid. By means of the action of the magnetic field, the shadow mask may be inserted, at least partially, into a substrate carrier and may be held atop the substrate. During substrate processing, mask handling is carried out, e.g. to exchange a mask between a loading module and the substrate carrier.

Furthermore, the mask may be exchanged between different substrate carriers and may be used for processing different substrates. Such kind of mask handling typically is carried out with a high accuracy. In addition to that, the mask may be transported from one substrate carrier to another substrate carrier requiring an efficient handling of a mask adapted for masking the substrate to be processed. An efficient and accurate adjusting and fixing of the mask on the substrate carrier is an issue. For fixing the mask at the substrate carrier, a magnetic force provided by magnetic fields may be used in addition to mechanical clamping.

A method for handling a mask for processing a substrate may include a process for selectively masking a substrate to be processed in order to prevent deposition of material onto selected target regions of the substrate surface. The method may include providing a substrate carrier, attaching the substrate to be processed to the substrate carrier, providing the mask for masking the substrate to be processed, connecting the mask and the carrier by means of a first magnetic field, generating a second magnetic field for at least partially compensating the first magnetic field, and releasing the mask from the substrate carrier.

FIG. 1 illustrates a schematic block diagram of a magnetic holding device 100 according to a typical embodiment. A mask foil 202 held by a mask frame 203 is used for processing a substrate (not shown in FIG. 1). Furthermore, a permanent magnet solenoid unit 300 is provided which is adapted for handling the mask frame 203 by means of the action of a magnetic field. The magnetic field acting on the mask frame 203 may be a superposition (sum magnetic field) of a first magnetic field and at least one second magnetic field. The superposed magnetic field generates a magnetic force which may interact with magnetic material included at least partially in the mask frame 203 such that the mask device 201 is attracted by the magnetic force.

As will be described herein below with reference to FIG. 4, the first magnetic field may be generated by means of a permanent magnet, wherein the second magnetic field may be generated by means of a solenoid coil. The first and second magnetic fields may be provided such that they cancel out each other, at least partially. A compensation of the first magnetic field by means of the second magnetic field results in a reduced magnetic force acting on the mask device 201. By switching or controlling a current flowing through the solenoid coil generating the second magnetic field, mask handling may be provided by means of a switching unit 104 which may be controlled a control unit 105.

During substrate processing, at predetermined moments in time the control unit 105 may transmit a control signal to the switching unit 104 which in turn is adapted for switching on the second magnetic field such that the first magnetic field is compensated, at least partially. During such kind of compensation of the first magnetic field, the mask frame 203 together with the mask foil 202 may be released from a substrate carrier (not shown in FIG. 1). At a time when the current through the solenoid coil is switched off by the switching unit 104, a full amount of the first magnetic field acts on the mask frame 203 such that the mask frame is held fixedly at its position. Such kind of handling of a mask adapted for masking a substrate to be processed is described in more detail with reference to FIGS. 2 to 4 herein below.

In accordance with a typical embodiment which can be combined with other embodiments described herein, the permanent magnet solenoid unit 300 shown in FIG. 1 may be a combination of a permanent magnet providing the first magnetic field and an electrical coil providing the second magnetic field. Thus, the permanent magnet solenoid unit 300 may be referred to as a permanent holding solenoid (PHS).

The permanent magnet solenoid 300 is adapted for generating an appropriately adjustable magnetic sum field which is adapted for holding and releasing the mask for masking a substrate to be processed. The PHS 300 may be mounted in the substrate carrier such that the mask may be held atop the substrate. Depending on when the mask may be handed over, the magnets may be switched forced or forceless. A reliable function in case of power outage is assured because the PHS force is present without current through the PHS device. Thus, in coating tools where the substrate carrier and/or the mask is moving, a power supply during such kind of movement is not required.

Figure 2:
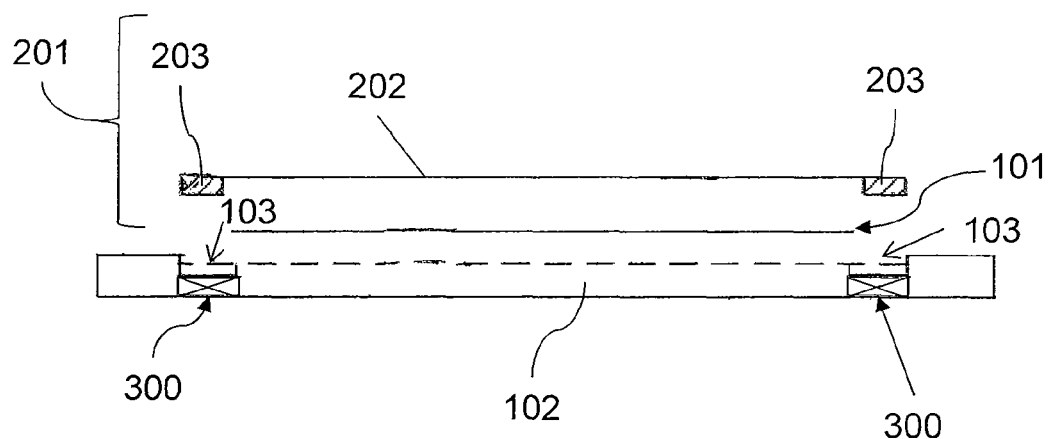
FIG. 2 is a side sectional view of a substrate carrier having two permanent magnet solenoid units adapted for handling a mask, according to another typical embodiment.

FIG. 2 is a side-sectional view of a magnetic holding device 100 according to a typical embodiment. As shown in FIG. 2, two permanent magnet solenoid units 300 are provided within a substrate carrier 102. The permanent magnet solenoid units 300 are arranged within a recess 103 of the substrate carrier 102. A substrate 101 and a mask device 201 are shown above the substrate carrier 102 in an exploded view. The mask device 201 includes a mask foil 202 held by a mask frame 203. The mask frame may be made of a magnetic material such as, but not restricted to Invar.

The mask frame 203 may thus be attracted by a magnetic field generated by the permanent magnetic solenoid unit 300. Mask handling may be provided in such a way that for substrate processing such as a deposition process for coating the substrate to be processed, the mask device 201 may be held by a magnetic action of a magnetic field generated by the permanent magnet solenoid units 300, wherein during transport or moving of the mask device 201, the mask device 201 is released from the substrate carrier 102 by switching off the magnetic field of the permanent magnet solenoid unit 300. Thus, FIG. 2 illustrates a situation, where the magnetic field of the permanent magnet solenoid unit 300 is switched off such that the mask device 201 including the mask foil 202 and the mask frame 203 may be detached from the substrate carrier 102.

Figure 3:
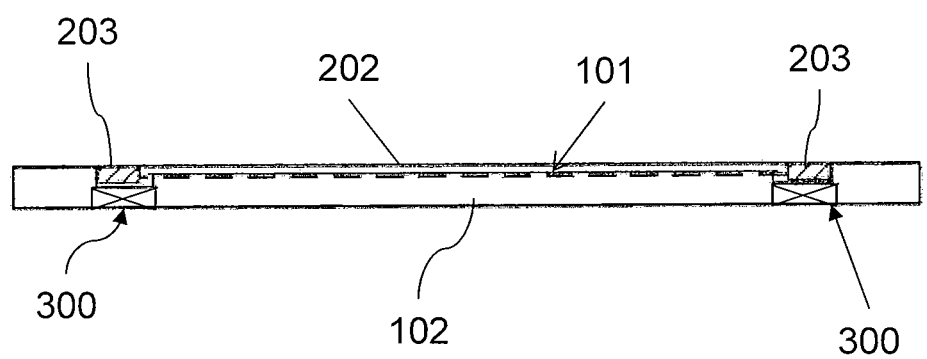
FIG. 3 is a side-sectional view of a substrate carrier corresponding to the side-sectional view of FIG. 2, wherein the substrate and the mask are held by a magnetic force of the permanent magnet solenoid unit.

FIG. 3 is a side-sectional view of a magnetic holding device 100 including a substrate carrier 102, according to a typical embodiment. In contrast to the situation shown in FIG. 2, FIG. 3 indicates a situation where the mask device 201 is held at the substrate carrier 102 by the action of magnetic fields generated by the permanent magnet solenoid units 300. It is noted here that, albeit two permanent magnet solenoid units 300 are shown, only one permanent magnet solenoid unit 300 or more than two permanent magnet solenoid units 300 may be provided in order to hold the mask device 201 at the substrate carrier 102.

According to typical embodiments which can be combined with other embodiments described herein, the substrate 101 may be embedded between the substrate carrier 102 and the mask foil 202 of the mask device 201. The mask frame 203 of the mask device 201 (see also FIG. 2) is attracted by the magnetic force of the magnetic field generated by the permanent magnetic solenoid units 300 such that the mask frame 203 is received in the recess 103 (FIG. 2). By switching the permanent magnet solenoid units 300 force or forceless, the mask device 201 may be handled such that, during substrate processing, the mask device is in a position shown in FIG. 3, wherein, during moving the mask device 201, for example to another processing location, the mask device 201 is detached from the substrate carrier 102 as shown in FIG. 2. The mask foil 202 is held by the mask frame 203, wherein the mask frame 203 and/or the mask foil 202 interact with the magnetic field generated by the permanent magnet solenoid unit 300. Thus, a magnetic clamping of the mask device 201 and the substrate 101 at the substrate carrier 102 may be provided. It is noted here that the solenoid 302 adapted for generating the second magnetic field adapted for at least partially compensating the first magnetic field for removing the mask may also be used during attaching the mask device and/or adjusting the mask device 201 with respect to markers which may be provided at the substrate 101 and at the mask device 201. In this case the solenoid 302 may be used for compensating the first magnetic field such that the mask device 201 may be brought close to the substrate without an attracting magnetic force. Thus the mask device 201 may be handled smoothly with respect to the substrate 101 and the substrate carrier 102. Due to the absence of a magnetic force a transfer of the mask device 201 onto the substrate carrier 102 may be provided with high accuracy. The mask device 201 may be handed over at a small distance with respect to the substrate carrier 102. Thus a sudden placement of the mask device 201 onto the substrate carrier 102 due to a magnetic force generated by the permanent magnet 301 may be avoided. By compensating the first magnetic field it is thus possible to adjust the mask device 201 accurately with minor space between the mask device 201 and the substrate carrier 102.

According to another typical embodiment which can be combined with other embodiments described herein, the mask frame 203 of the mask device 201 is adapted to match with the recess 103 shown in FIG. 2. Thus, an upper surface of the mask foil 202 and an upper surface of the mask frame 203 may form a planar surface with an adjacent surface of the substrate carrier 102. Thus, a cross-sectional area of the mask frame 203 may correspond to a cross-sectional area of the recess 103.

Figure 4:
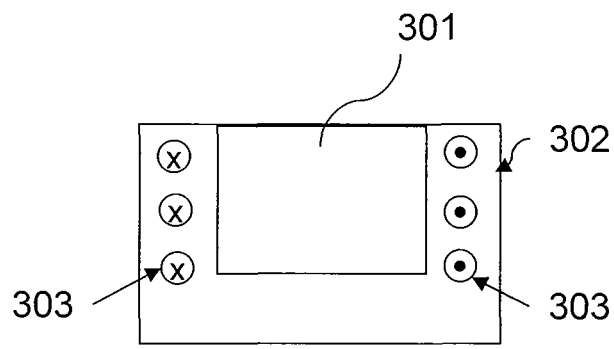
FIG. 4 is a side-sectional view of a permanent magnet solenoid unit including a permanent magnet and a solenoid, according to another typical embodiment.

A generation of the second magnetic field which is adapted for at least partially compensating the first magnetic field and which is described herein below with respect to FIG. 4 is provided at a predetermined location of the mask frame 203 of the mask device 201. If the first magnetic field is compensated, at least partially, the mask frame 203 may be released from the permanent magnet solenoid units 300, and in turn, from the substrate carrier 102. As the first magnetic field may be provided by a permanent magnet, a powerless holding of the mask frame 203 together with the mask foil 202 of the mask device 201 can be achieved by means of the first magnetic field. Then, electrical power is applied at the solenoid coil for compensating, at least partially, the first magnetic field by means of the second magnetic field generated by the solenoid coil (see FIG. 4 herein below), and the mask device 201 may be released from the substrate carrier 102. It is noted here that providing the second magnetic field may include reducing the first magnetic field to zero at the location of the mask frame 203.

FIG. 4 is a cross-sectional view of a permanent magnet solenoid unit 300 according to a typical embodiment. As shown in FIG. 4, the permanent magnet solenoid unit 300 includes a permanent magnet 301 and a solenoid (solenoid coil) 302. The solenoid coil 302 may be formed from at least one electrical conductor 303 which may be wound in a cylindrical shape around the permanent magnet 301. Depending on the orientation of the permanent magnet 301, a current may be flown through the electrical conductor 303 in a direction indicated by the crosses and dots in FIG. 4.

Thus, a resulting magnetic field provided by the permanent magnet solenoid unit 300 is a superposition of a first magnetic field generated by the permanent magnet 301 and a second magnetic field generated by the solenoid 302. A current flowing through the electrical conductor 303 may thus be provided in a direction such that the first magnetic field generated by the permanent magnet 301 is compensated, at least partially, by the second magnetic field generated by the solenoid 302. The solenoid 302 may act as a neutralizing magnetic source for neutralizing or at least partially compensating the first magnetic field provided by the permanent magnet 301. Such neutralization or compensation may be provided within a short time in a range from 100 microseconds to 10 milliseconds, and typically in approximately a few milliseconds. Thus, the permanent magnet solenoid unit 300 may include the permanent magnet 301 for generating the first magnetic field and the solenoid 302 for switching on and off the second magnetic field which compensates, at least partially, the first magnetic field.

Figure 5:
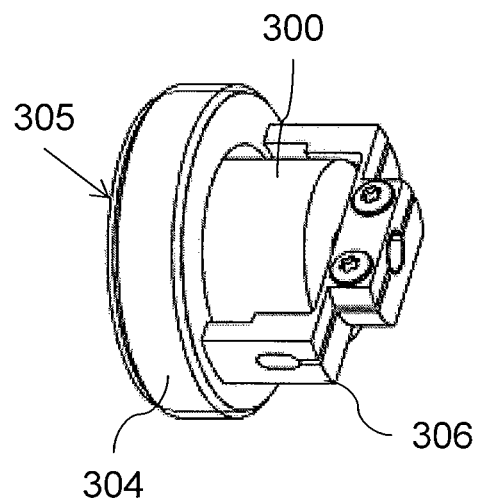
FIG. 5 is a perspective view of a permanent magnet solenoid unit having attached thereon a support unit and a bracket for mounting the permanent magnet solenoid unit.
Figure 6:
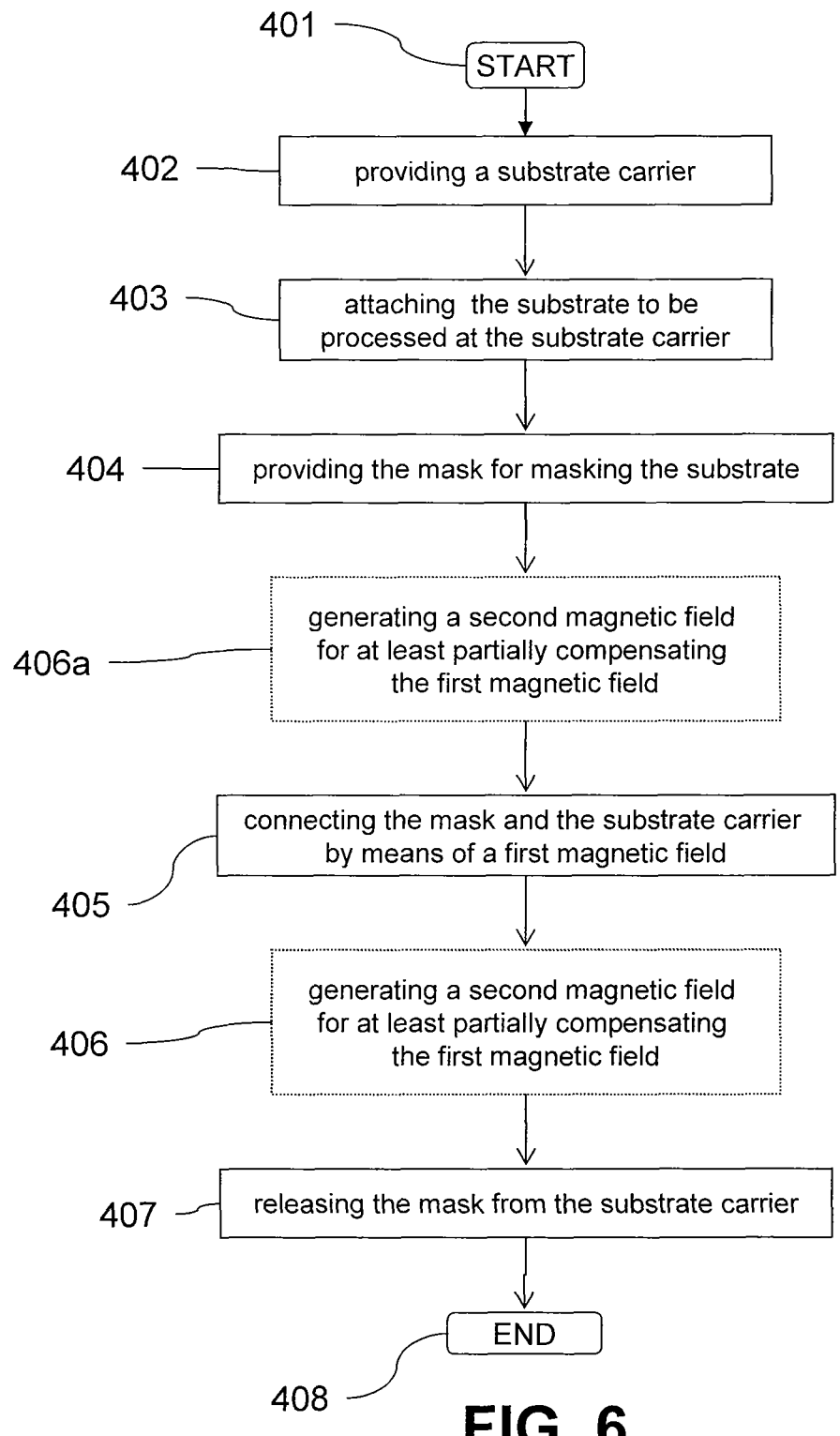
FIG. 6 is a flowchart illustrating a method for handling a mask during substrate processing.

FIG. 5 is a perspective view of a fixture for a permanent magnet solenoid unit 300. The permanent magnet solenoid unit 300 may be attached to a support unit 304, according to yet another typical embodiment which can be combined with other embodiments described herein. The permanent magnet solenoid unit 300 attached to the support unit 304 is held by a mounting bracket 306 adapted for attaching the entire permanent magnetic solenoid unit 300 to a substrate carrier 102 or to another location within the substrate processing apparatus. As shown in FIG. 4 and FIG. 5, the permanent magnet 301 and the solenoid 302 may be formed as an integral device, wherein the permanent magnet 301 is arranged inside the solenoid 302. Typically, the permanent magnet 301 may be arranged in the center of the solenoid 302. The permanent magnet solenoid unit 300 may further include a rubber unit 305 which may be arranged between the support unit 304 and the mask device 201 such that the mask device 201 is fixed at the support unit 304 without slippage. The fixture shown in FIG. 5 provides an efficient holding of the mask device 201, because the permanent magnet solenoid unit 300 may be adjusted with respect to other permanent magnet solenoid units 300 provided for holding the mask device 201.

Furthermore, the rubber unit 305 may be arranged between the substrate carrier 102 and the mask device 201 for fixing the mask device 201 at the substrate carrier 102. The rubber unit 305 may include a material selected from the group consisting of an elastomer such as Viton, FKM, NBR, and any combination thereof. Thus, the mask device 201 may be fixedly held at the substrate carrier 102 using the rubber unit 305.

FIG. 7 is a flowchart illustrating a method for handling a mask for processing a substrate 101. At a block 401, the procedure is started. Then, at a block 402, a substrate carrier 102 is provided. The substrate 101 to be processed is attached to the substrate carrier 102 (block 403). Furthermore, a mask device 201 adapted for masking the substrate 101 to be processed is provided at a block 404. Then, the mask device 201 including the mask foil 202 and the mask frame 203, and the substrate carrier are connected by means of the first magnetic field (block 405). It is noted here that mask handling according to some embodiments described herein produces less amount of particles, is faster, provides an operation without counter forces and is save with respect to power outage, as compared to conventional mask handling.

The substrate 101 may now be processed, e.g. a coating may be applied onto the upper surface of the substrate 101. After substrate processing, a second magnetic field may be generated, the second magnetic field being adapted for at least partially compensating the first magnetic field. If the first magnetic field is at least partially compensated by the second magnetic field, a magnetic force holding the mask device 201 is reduced such that the mask device 201 may be released from the substrate carrier 102 (block 407). The procedure is ended at a block 408. It is noted here, as indicated by the dotted lines of 406 and 406a, that the method for handling the mask device 201 for processing the substrate 101 may additionally or alternatively to step 406 be used during mounting, attaching and/or adjusting the mask device 201 with respect to the substrate 101 and/or the substrate carrier 102. Such adjustment may be based on markers provided at the substrate 101 and/or at the mask device 201. Thus the solenoid 302 adapted for generating the second magnetic field adapted for at least partially compensating the first magnetic field for removing the mask may also be used for compensating the first magnetic field during adjusting the mask device 201 with respect to the markers provided at the substrate 101. The mask device 201 may be brought close to the substrate without an attracting magnetic force such that a sudden placement of the mask device 201 onto the substrate carrier 102 due to a magnetic force generated by the permanent magnet 301 may be avoided.

In light of the above, a plurality of embodiments have been described. For example, according to one embodiment, a magnetic holding device adapted for holding a mask and a substrate for processing the substrate is provided. The magnetic holding device includes a substrate carrier adapted for receiving the substrate to be processed, the substrate carrier including a permanent magnet adapted for generating a first magnetic field for holding the mask; and a solenoid adapted for generating a second magnetic field adapted for at least partially compensating the first magnetic field for removing the mask. According to an optional modification thereof, the permanent magnet and the solenoid are formed as an integral device, the permanent magnet being arranged in the center of the solenoid. According to yet further embodiments, which can be combined with any of the other embodiments and modifications above, the solenoid includes at least one electrical conductor. According to yet further additional or alternative modifications a rubber unit arranged between the substrate carrier and the mask and being adapted for fixing the mask at the substrate carrier without slippage is provided. According to an optional modification thereof, the rubber unit includes a material selected from the group consisting of an elastomer, Viton, FKM, NBR, and any combination thereof. According to yet further embodiments, which can be combined with any of the other embodiments and modifications above, the substrate carrier includes a recess adapted for receiving the mask. According to another embodiment, a method of handling a mask for processing of a substrate is provided. The method includes providing a substrate carrier; attaching the substrate to be processed to the substrate carrier; providing the mask for masking the substrate; connecting the mask and the substrate carrier by means of a first magnetic field; generating a second magnetic field for at least partially compensating the first magnetic field; and releasing the mask from the substrate carrier. According to yet further embodiments, which can be combined with any of the other embodiments and modifications above, the first magnetic field is generated by a permanent magnet. According to yet further additional or alternative modifications the second magnetic field is generated by a solenoid. Furthermore, the mask may be fixedly held at the substrate carrier by means of a rubber unit. According to an optional modification thereof, providing the second magnetic field includes compensating the first magnetic field, preferably to zero, at the location of the mask.

While the foregoing is directed to embodiments of the invention, other and further embodiments of the invention may be devised without departing from the basic scope thereof, and the scope thereof is determined by the claims that follow.

The invention claimed is:

1. A magnetic holding device adapted for holding a mask and a substrate for processing the substrate used in organic light emitting diodes, the magnetic holding device comprising:
   a substrate carrier adapted for receiving the substrate to be processed, the substrate carrier comprising:
      a permanent magnet adapted for generating a first magnetic field for holding the mask;
      a solenoid coil adapted for generating a second magnetic field adapted for reducing the first magnetic field by a superposition of the first magnetic field and the second magnetic field at the location of the mask for removing the mask, the solenoid coil being formed of at least one electrical conductor wound in a cylindrical shape around the permanent magnet; and
      a switching unit and a control unit, wherein a flow of current through the solenoid coil is provided by the switching unit which is controlled by the control unit;
   wherein the first magnetic field acts on the mask such that the mask is held in a fixed position when a current through the solenoid coil is off and the mask is released from the fixed position when the current through the solenoid is on.

2. The magnetic holding device in accordance with claim 1, wherein the permanent magnet and the solenoid are formed as an integral device, the permanent magnet being arranged in the center of the solenoid.

3. The magnetic holding device in accordance with claim 1, wherein the solenoid comprises at least one electrical conductor.

4. The magnetic holding device in accordance with claim 1, further comprising a rubber unit arranged between the substrate carrier and the mask and being adapted for fixing the mask at the substrate carrier without slippage.

5. The magnetic holding device in accordance with claim 4, wherein the rubber unit comprises an elastomer.

6. The magnetic holding device in accordance with claim 1, wherein the substrate carrier comprises a recess adapted for receiving the mask.

7. The magnetic holding device in accordance with claim 1, wherein the substrate carrier comprises a recess adapted for receiving the mask, and wherein a rubber unit is arranged between the substrate carrier and the mask and is adapted for fixing the mask at the substrate carrier without slippage.

8. The magnetic holding device in accordance with claim 7, wherein the rubber unit comprises an elastomer.

9. A method for handling a mask for processing of a substrate used in organic light emitting diodes, the method comprising:
   providing a substrate carrier;
   attaching the substrate to be processed to the substrate carrier;
   providing the mask for masking the substrate;
   connecting the mask and the substrate carrier by means of a first magnetic field;
   generating a second magnetic field reducing the first magnetic field by a superposition of the first magnetic field and the second magnetic field at the location of the mask; and
   releasing the mask from the substrate carrier;
   wherein a flow of current through a solenoid coil generating the second magnetic field is provided by a switching unit that is controlled by a control unit, and wherein the first magnetic field acts on the mask such that the mask is held in a fixed position when a current through the solenoid coil is off and the mask is released from the fixed position when the current through the solenoid is on.

10. The method in accordance with claim 9, wherein the first magnetic field is generated by a permanent magnet.

11. The method in accordance with claim 9, wherein the second magnetic field is generated by a solenoid.

12. The method in accordance with claim 9, wherein the mask is fixedly held at the substrate carrier by means of a rubber unit.

13. The method in accordance with claim 9, wherein generating the second magnetic field comprises reducing the first magnetic field to zero at the location of the mask.

14. A method for handling a mask for processing of a substrate used in organic light emitting diodes, the method comprising:
   providing a substrate carrier;
   attaching the substrate to be processed to the substrate carrier;
   providing the mask for masking the substrate;
   generating a second magnetic field reducing a first magnetic field by a superposition of the first magnetic field and the second magnetic field at the location of the mask;
   connecting the mask and the substrate carrier by means of a first magnetic field;
   generating the second magnetic field reducing the first magnetic field by a superposition of the first magnetic field and the second magnetic field at the location of the mask; and
   releasing the mask from the substrate carrier;
   wherein a flow of current through a solenoid coil generating the second magnetic field is provided by a switching unit which is controlled by a control unit, and wherein the first magnetic field acts on the mask such that the mask is held in a fixed position when a current through the solenoid coil is off and the mask is released from the fixed position when the current through the solenoid is on.

15. The method in accordance with claim 14, wherein the first magnetic field is generated by a permanent magnet.

16. The method in accordance with claim 14, wherein the second magnetic field is generated by a solenoid.

17. The method in accordance with claim 14, wherein the mask is fixedly held at the substrate carrier by means of a rubber unit.

18. The method in accordance with claim 14, wherein generating the second magnetic field before connecting the mask comprises reducing the first magnetic field to zero at the location of the mask.

19. The method in accordance with claim 14, wherein generating the second magnetic field before releasing the mask comprises reducing the first magnetic field to zero at the location of the mask.

20. The method in accordance with claim 14, wherein generating the second magnetic field before connecting the mask and before releasing the mask comprises reducing the first magnetic field to zero at the location of the mask.

* * * * *